(12) United States Patent
Nakano et al.

(10) Patent No.: US 9,034,541 B2
(45) Date of Patent: May 19, 2015

(54) COLOR FILTER SUBSTRATE MANUFACTURING METHOD, DISPLAY DEVICE MANUFACTURING METHOD, COLOR FILTER SUBSTRATE, AND DISPLAY DEVICE

(75) Inventors: Takayuki Nakano, Osaka (JP); Yutaka Miyajima, Osaka (JP); Hirokazu Yoshioka, Osaka (JP); Keita Katayose, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 31 days.

(21) Appl. No.: 14/118,927

(22) PCT Filed: May 24, 2012

(86) PCT No.: PCT/JP2012/063245
§ 371 (c)(1),
(2), (4) Date: Nov. 20, 2013

(87) PCT Pub. No.: WO2012/165269
PCT Pub. Date: Dec. 6, 2012

(65) Prior Publication Data
US 2014/0091343 A1  Apr. 3, 2014

(30) Foreign Application Priority Data
May 31, 2011 (JP) .................................. 2011-121610

(51) Int. Cl.
*G02B 5/20* (2006.01)
*H01L 33/50* (2010.01)
(Continued)

(52) U.S. Cl.
CPC .......... *H01L 33/50* (2013.01); *G02F 1/133516* (2013.01); *H01L 27/124* (2013.01); *H01L 27/1262* (2013.01); *H01L 27/153* (2013.01)

(58) Field of Classification Search
CPC ....... G03F 7/0007; G03F 7/105; G03F 7/004; G09G 2300/0666; G09F 9/33; G09F 3/14; G09F 3/18
See application file for complete search history.

(56) References Cited

U.S. PATENT DOCUMENTS 6,874,883 B1   4/2005  Shigemura et al.
8,547,506 B2 * 10/2013  Tsao et al. ................... 349/106
(Continued)

FOREIGN PATENT DOCUMENTS

JP       09-138306 A     5/1997
JP       2002-328216 A  11/2002
(Continued)

OTHER PUBLICATIONS

Official Communication issued in International Patent Application No. PCT/JP2012/063245, mailed on Aug. 28, 2012.

*Primary Examiner* — Lamson Nguyen
(74) *Attorney, Agent, or Firm* — Keating & Bennett, LLP

(57) ABSTRACT

The present invention provides a color filter substrate manufacturing method which can prevent the occurrence of color mixing between adjacent pixels despite of the use of an inkjet method, and which are unlikely to cause flicker when used for displays such as televisions. The prevent invention is a color filter substrate manufacturing method including: a first inkjet step of applying inks simultaneously to at least two of a plurality of regions separated by a grid-shaped partition; and a second inkjet step of applying an ink to at least one of regions to which the inks are not applied in the first inkjet step, wherein at least one of inks applied in the first inkjet step is a first ink that is applied to a first target region without applying inks to regions vertically and horizontally adjacent to the first target region, and at least one of the other inks applied in the first inkjet step is a second ink that is applied to a second target region while another ink is applied to one of regions vertically and horizontally adjacent to the second target region.

14 Claims, 14 Drawing Sheets

(51) Int. Cl.
  *G02F 1/1335* (2006.01)
  *H01L 27/12* (2006.01)
  *H01L 27/15* (2006.01)

(56) References Cited

U.S. PATENT DOCUMENTS 8,736,991 B2 * 5/2014 Lin et al. .................. 359/885
8,758,965 B2 * 6/2014 Kim .................. 430/7
8,841,144 B2 * 9/2014 Yu et al. .................. 438/29
2005/0024403 A1 2/2005 Shigemura et al.
2006/0228469 A1 10/2006 Shigemura et al.

FOREIGN PATENT DOCUMENTS

JP 2003-232912 A 8/2003
JP 2008-089896 A 4/2008

* cited by examiner

COLOR FILTER SUBSTRATE MANUFACTURING METHOD, DISPLAY DEVICE MANUFACTURING METHOD, COLOR FILTER SUBSTRATE, AND DISPLAY DEVICE

TECHNICAL FIELD

The present invention relates to a color filter substrate manufacturing method, a display device manufacturing method, a color filter substrate, and a display device. More specifically, the present invention relates to a color filter substrate manufacturing method including steps of producing color filters by an inkjet process, a display device manufacturing method including the color filter substrate manufacturing method, a color filter substrate manufactured by the color filter substrate manufacturing method, and a display device including the color filter substrate.

BACKGROUND ART

General color filter substrates include color filters of a plurality of colors arranged in a regular pattern on a substrate such as a glass substrate. Some color filters are placed for each element unit for color display, called pixel, and the typical color combination of color filters is three primary colors, red (R), green (G), and blue (B).

The primary process for the production of color filters is photolithography. In order to produce color layers, this process involves repeating a cycle consisting of application, exposure, development, and baking for the number of times corresponding to the number of colors.

In contrast, an inkjet process can save the time required to finish the entire process because layers of different colors can be produced in a one-stage procedure by using an inkjet apparatus provided with a plurality of heads, specifically by applying inks of different colors from the respective heads. A further advantage of the inkjet process is that this process does not need exposure and development because inks can be applied only to desired regions.

The following are some examples of conventional modified inkjet processes: a process in which pixels are respectively colored with desired colors by controlling the position of a plurality of ink ejecting nozzles and the inter-nozzle distance under certain conditions in relation to the distance between pixels (e.g. Patent Literature 1); a process in which colored regions are produced by using an inkjet head provided with a plurality of nozzles and applying inks to to-be-colored regions more than once by using different nozzles for each application (e.g. Patent Literature 2); a process involving performing multi-stage ink application to to-be-colored regions while running an inkjet head (e.g. Patent Literature 3); and a process for producing colored layers which involves steps of application by an inkjet method and pre-curing of applied materials, and repeating these steps (e.g. Patent Literature 4).

CITATION LIST

Patent Literature

Patent Literature 1: JP H9-138306 A
Patent Literature 2: JP 2002-328216 A
Patent Literature 3: JP 2003-232912 A
Patent Literature 4: JP 2008-89896 A

SUMMARY OF INVENTION

Technical Problem

The present inventors studied various methods for producing color filters by an inkjet method, and found that when inks are applied to regions of a certain size (hereinafter, also referred to as picture element aperture regions) separated by a partition (hereinafter, also referred to as bank) in the production of color filters, different colors of some pairs of adjacent color filters may be mixed, which results in an undesired color filter design. This is likely to occur when inks of different colors are successively applied to a plurality of picture element aperture regions in a one-stage procedure.

FIG. 16 is a plan view schematically illustrating color filters, the colors of which are mixed as a result of a one-stage procedure of applying inks of different colors to a plurality of picture element aperture regions. This is an example formed by applying inks of three colors, red, green, and blue, to three picture element aperture regions arranged horizontally. These inks are applied to the regions separated by a bank 92. Unfortunately, when droplets of the green and blue inks contact with each other in the ink application procedure, droplets coalesce together due to their surface tension. As a result, as shown in FIG. 16, color filters 91 with a mixed color may be formed in the region for a green color filter and the region for a blue color filter. Such regions with a mixed color are defect regions which are responsible for an undesired color balance.

In this context, the present inventors tried to remove such mixed color defects by removing defect regions by using a laser and tried to re-apply inks thereto. FIG. 17 is a plan view schematically illustrating color filters after removing regions with a mixed color by using a laser. FIG. 18 is a plan view schematically illustrating color filters after re-application of inks following the removal using a laser.

As shown in FIG. 17, the defect regions can be almost completely removed by using a laser. However, areas along the peripheries of picture element aperture regions are difficult to completely remove, and partially remain as rims 93. Namely, it is impossible to form apertures with the completely same size and shape as the regions surrounded by the bank 92 using a laser. Thus, defects can be somewhat repaired by removal of inks with a laser and re-application of inks, but this technique is not enough to sufficiently repair the defects because regions with a mixed color of the color of the rims 93 and the color of re-applied inks are visually recognizable as shown in FIG. 18.

The present inventors studied various strategies to prevent mixed color defects, and focused on the fact that colors are mixed when inks are applied to a plurality of picture element aperture regions in a one-stage procedure. Accordingly, the present inventors tested two-stage ink application. This ink application method is specifically as follows: target lithography regions are chosen; inks are applied to the target lithography regions but are not applied to regions adjacent to the target lithography regions in this procedure; and then inks are applied to the lithography regions adjacent to the ink-deposited regions. Thus, this method is designed such that color filters adjacent to each other are produced at different timings.

FIGS. 19 and 20 are plan views schematically illustrating pairs of color filters of the same color which are produced by applying an ink to one of each pair of adjacent picture element aperture regions, and successively applying an ink to the other picture element aperture region. FIG. 19 shows a lithography pattern after the first ink application, and FIG. 20 shows a lithography pattern after the second ink application. FIG. 21 is a schematic cross-sectional view of a color filter shown in FIG. 19, and FIG. 22 is a schematic cross-sectional view of a color filter shown in FIG. 20. As shown in FIGS. 19 and 20, color filters of different colors are produced in the picture element aperture regions surrounded by a bank 82. The color filters include three types, red color filters 81R, green color filters 81G, and blue color filters 81B.

As shown in FIGS. 19 and 20, the two-stage ink lithography reduces the probability of mixed color defects. A strategy intended for the bank 82 is a liquid repelling treatment. This treatment prevents inks from running on the bank 82, and thus prevents color mixing when performed on the surface of the bank 82 before the first ink lithography such that each region surrounded by the bank 82 can hold an ink. Even when this treatment is performed, components in inks evaporate to reduce the liquid repellency of the bank 82 around inks applied to the substrate in the first stage. A comparison between FIGS. 19 and 20 reveals that the second inkjet lithography leaves more ink on the bank 82 than the first inkjet lithography does. This suggests that the liquid repellency of the surface of the surrounding bank 82 is reduced after the first inkjet lithography. Also, a comparison between FIGS. 21 and 22 reveals that inks applied by the first lithography and inks applied by the second lithography differ in thickness due to the difference in the degree of running on the bank 82. Such color filters differing in thickness, when incorporated in a television or the like, will cause flicker in a dot inversion mode.

In light of the background, the present invention aims to provide a color filter substrate manufacturing method which can prevent the occurrence of color mixing between adjacent picture elements despite of the use of an inkjet method, and which are unlikely to cause flicker when used for displays such as televisions.

Solution to Problem

The present inventors studied various approaches for preventing flicker attributed to the thickness difference between color filters produced by the first lithography and color filters produced by the second lithography. Finally, the present inventors found that a significant thickness difference between color filters produced by the first ink application and color filters produced by the second ink application can be avoided when target picture element aperture regions to which inks are applied in the first ink application stage include some pairs of adjacent regions, unlike when inks are not applied to all regions adjacent to the target lithography regions. Based on this finding that solves the above problems, the present inventors completed the present invention.

That is, one aspect of the present invention is a color filter substrate manufacturing method including: a first inkjet step of applying inks simultaneously to at least two of a plurality of regions separated by a grid-shaped partition; and a second inkjet step of applying an ink to at least one of regions to which the inks are not applied in the first inkjet step, wherein at least one of inks applied in the first inkjet step is a first ink that is applied to a first target region without applying inks to regions vertically and horizontally adjacent to the first target region, and at least one of the other inks applied in the first inkjet step is a second ink that is applied to a second target region while another ink is applied to one of regions vertically and horizontally adjacent to the second target region.

The manufacturing method provides color filter substrates including color filters arranged in a plurality of regions separated by a grid-shape partition. One example of color filter substrates is a color filter substrate that includes a partition with a predetermined shape formed by patterning and color filters on a supporting substrate made of glass, a resin, or the like. Preferably, in order to prevent light leakage and mixed colors, the partition has a light shielding property.

The manufacturing method includes: a first inkjet step of applying inks simultaneously to at least two of regions; and a second inkjet step of applying an ink to at least one of regions to which the inks are not applied in the first inkjet step. These inkjet steps can be performed by using an inkjet apparatus provided with an inkjet head having a plurality of nozzles. The number of inkjet steps of the manufacturing method is not especially limited, provided that it is two or more. In terms of manufacturing efficiency, the number of inkjet steps is preferably two. Namely, it is preferable that lithography to the plurality of regions separated by the grid-shaped partition is completed only by the first inkjet step and the second inkjet step.

At least one of inks applied in the first inkjet step is a first ink that is applied to a first target region without applying inks to regions vertically and horizontally adjacent to the first target region. The first ink uniformly spreads in a picture element aperture region to form a flat surface. This significantly reduces the probability of color mixing between adjacent picture element aperture regions. Additionally, the first ink does not form a thin region, which can cause light leakage, and reduction of color purities.

At least one of the other inks applied in the first inkjet step is a second ink that is applied to a second target region while another ink is applied to one of regions vertically and horizontally adjacent to the second target region. The second ink cannot form a surface as flat as the first ink does due to the influence of ink(s) on adjacent picture element aperture regions(s), but forms a flatter surface as compared to when inks are applied to all adjacent picture element aperture regions. A further advantage of the second ink is to reduce the difference in thickness between color filters produced in the first inkjet step and color filters produced in the second inkjet step.

The manufacturing method essentially has the above-mentioned features, and is not especially limited by other features. The following description is offered to specifically illustrate preferred embodiments in the manufacturing method.

The manufacturing method preferably includes, between the first inkjet step and the second inkjet step, a pre-baking step for drying the inks applied in the first inkjet step. The term "pre-baking step" as used herein means a step involving a heat treatment for removing the flowability of inks. This step differs from general baking (post-baking) in terms of baking temperature. This step sufficiently evaporates volatile solvents, and therefore ensures that ink(s) sufficiently spread(s) in the second inkjet step. Even when an ink applied in the second inkjet step flows onto an ink applied in the first inkjet step, these inks do not mix with each other anymore after the pre-baking step. Thus, this step prevents color and brightness differences, which are responsible for low visibility.

The manufacturing method preferably includes, before the first inkjet step, a liquid repelling step of liquid repelling treatment to the surface of the grid-shaped partition. The manufacturing method preferably includes, between the first inkjet step and the second inkjet step, a liquid repelling step of liquid repelling treatment to the surface of the partition surrounding the inks applied in the first inkjet step. These liquid repelling treatments on the surface of the partition before the inkjet steps are effective in maintaining the applied inks within the regions surrounded by the partition. In particular, in the case where the manufacturing method includes two or more application steps, the liquid repelling treatment before the second inkjet step is effective against reduction of the liquid repellency attributed to evaporation from the inks applied in the first application step. Examples of the liquid repelling treatments include plasma treatments such as a fluorine-containing plasma treatment. These treatments prevent inks from running on the partition and flowing into adjacent picture elements, and therefore effectively reduce the probability of color mixing. A further advantage of these treatments is to prevent a large difference in thickness between color filters produced in the first inkjet step and color filters produced in the second inkjet step.

The manufacturing method preferably includes, between the first inkjet step and the second inkjet step, a modification step of removing an ink applied in the first inkjet step by using a laser. Even when applied using the manufacturing method of the present invention, inks may flow out of a target pixel of an inkjet step into adjacent picture elements under some conditions. In such a case, an ink of an undesired color is removed by using a laser to prevent mixed colors.

Preferably, color filters are produced in the first inkjet step and the second inkjet step such that pixel units each consisting of color filters of a plurality of colors are repeatedly arranged. In this embodiment, the kind of colors, the number of colors, and the arrangement pattern of colors in each pixel unit are not especially limited. However, in all the pixels, the arrangement pattern of colors is the same. This embodiment improves the manufacturing efficiency.

Preferably, color filters are produced in the first inkjet step such that vertically adjacent pixel units and/or horizontally adjacent pixel units have alternating color arrangement patterns. In structures where at least horizontally or vertically adjacent pixels have different color arrangement patterns, unfilled regions are effectively distributed around target picture element aperture regions. These structures reduce the probability of color mixing and enable production of more color filters having a uniform thickness distribution.

Preferably, the first ink has a color with the lowest transmissivity among the plurality of colors. Color mixing involving a color with a lower transmissivity will be a more noticeable defect. This embodiment can avoid such a severe defect.

Preferably, each of the pixel units consists of a combination of a red picture element, a green picture element, and a blue picture element, and the first ink is a blue ink. Color mixing involving the blue ink, which has the lowest transmissivity among inks of these three colors, will be the severest defect. Specifically, mixing of green and blue results in formation of a black spot defect from green and formation of a bright spot defect from blue. Bright spots are the most critical defect. Accordingly, the measures against color mixing are preferably targeted for blue among other colors.

Preferably, each of the pixel units consists of a combination of a red picture element, a green picture element, a blue picture element, and a yellow picture element, and the first ink is a blue ink, more preferably a blue ink and a green ink. Since color mixing involving the blue ink, which has the lowest transmissivity, will be the severest defect, as described above, the measures against color mixing are preferably targeted for blue among other colors. When mixed with blue, green will cause the severest defect among the above colors. Accordingly, the same measures against color mixing as those for blue are preferably performed for green as well.

The first ink and the second ink may be applied in such a manner as to produce color filters in the same pixel or in different pixels, respectively. An advantage of the manner that produces color filters in the same pixel is that mixed color defects are unlikely to occur over multiple pixels. An advantage of the manner that produces color filters in different pixels is that the degree of freedom of the lithography patterns is high and the numbers of color choices for the first application and the second application are large.

Another aspect of the present invention is a display device manufacturing method including the color filter substrate manufacturing method, still another aspect of the present invention is a color filter substrate manufactured by the manufacturing method, and still another aspect of the present invention is a display device including the color filter substrate. Examples of display devices manufactured by the manufacturing method of the present invention include liquid crystal display devices, organic electroluminescence display devices, inorganic electroluminescence display devices, and the like. These display devices are not especially limited provided that they include a color filter substrate. Color filter substrates manufactured by the manufacturing method remarkably contribute to reduction of flicker. Accordingly, these color filter substrates are suitably used, in particular, in dot-inversion mode display devices. Namely, the display devices are particularly suitably used when including a driving means in which a plurality of pixel electrodes and a common electrode is provided, and for each pair of adjacent pixel electrodes among the plurality of pixel electrodes, the pixel electrodes have a potential with an opposite polarity based on a potential of the common electrode.

Advantageous Effects of Invention

The color filter substrate manufacturing method of the present invention can prevent the occurrence of color mixing between adjacent pixels despite of the use of an inkjet method, and can suppress the occurrence of flicker attributed to thickness differences when used for display devices.

DESCRIPTION OF EMBODIMENTS

The following description is offered to illustrate the present invention based on embodiments with reference to the drawings, and is not intended to limit the present invention only to these embodiments.

The term "picture element" as used herein refers to a region separated by a partition and each corresponding to a single color filter. A combination of picture elements of a plurality of colors constitutes a "pixel".

Figure 23:
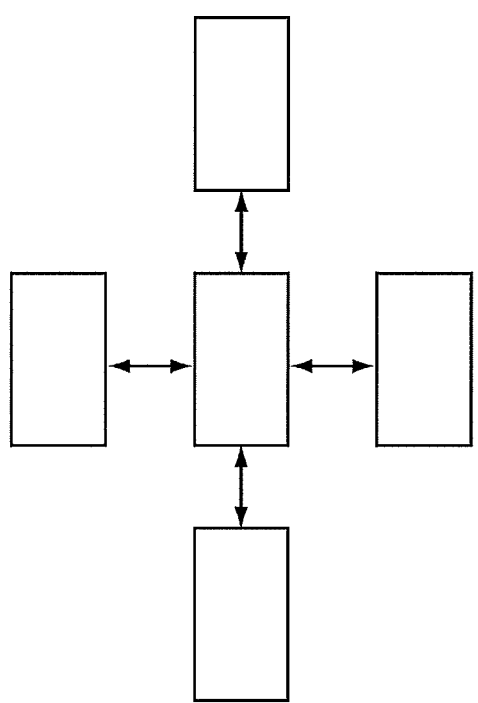
FIG. 23 is a view illustrating the definition of the term "adjacent" as used in the present invention.

The term "adjacent" as used herein refers to a pair consisting of two parallel components arranged vertically or horizontally next to each other as shown in FIG. 23. Specifically, the expression "adjacent picture elements" refers to a pair of parallel picture elements arranged vertically or horizontally next to each other, and the expression "adjacent pixels" refers to a pair of parallel pixels arranged vertically or horizontally next to each other.

Embodiment 1

Embodiment 1 is an example of the color filter substrate manufacturing method and the display device manufacturing method of the present invention.

Figure 1:
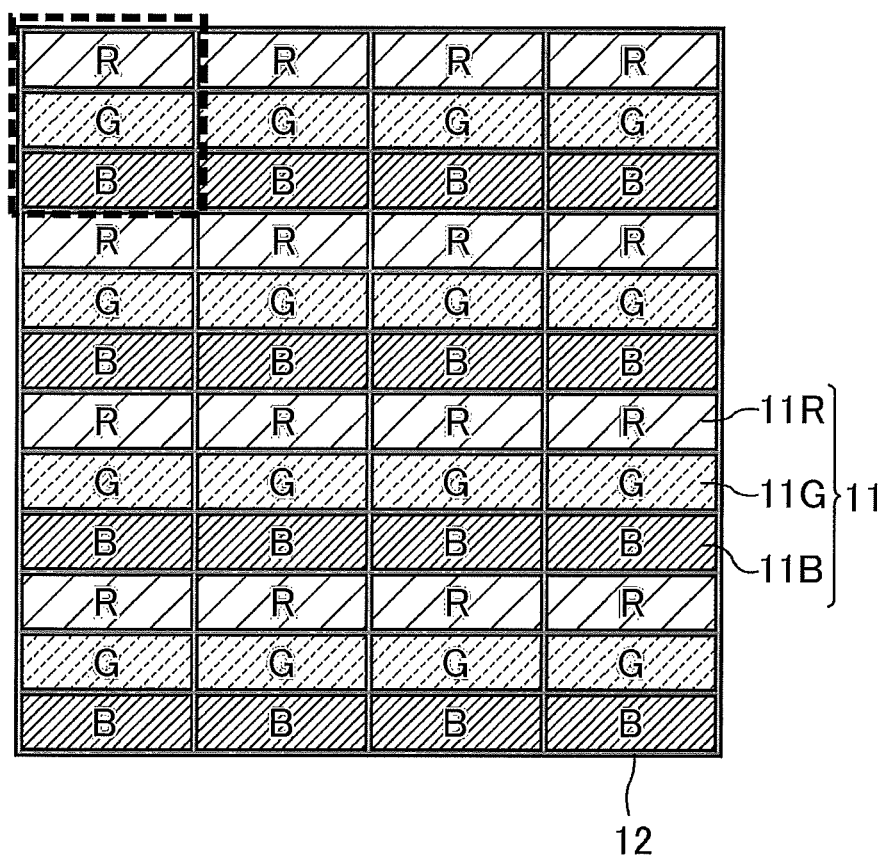
FIG. 1 is a plan view schematically illustrating a color arrangement pattern of a color filter substrate of Embodiment 1.

FIG. 1 is a plan view schematically illustrating a color arrangement pattern of a color filter substrate of Embodiment 1. In Embodiment 1, as shown in FIG. 1, a plurality of pixels each consisting of three picture elements of three different colors, red, green, and blue, are arranged on a color display screen. The picture elements are substantially rectangular, and are arranged vertically in the order of red, green, and blue in a matrix. In FIG. 1, a region surrounded by the dotted line corresponds to one pixel. On the respective regions for red, green, and blue picture elements, red color filters 11R, green color filters 11G, and blue color filters 11B are produced. These color filters 11 are individually separated by a bank (partition) 12. The arrangement pattern of picture elements in each pixel is the same, and specifically is a stripe arrangement pattern in which picture elements of the same color are arranged horizontally.

Figure 2:
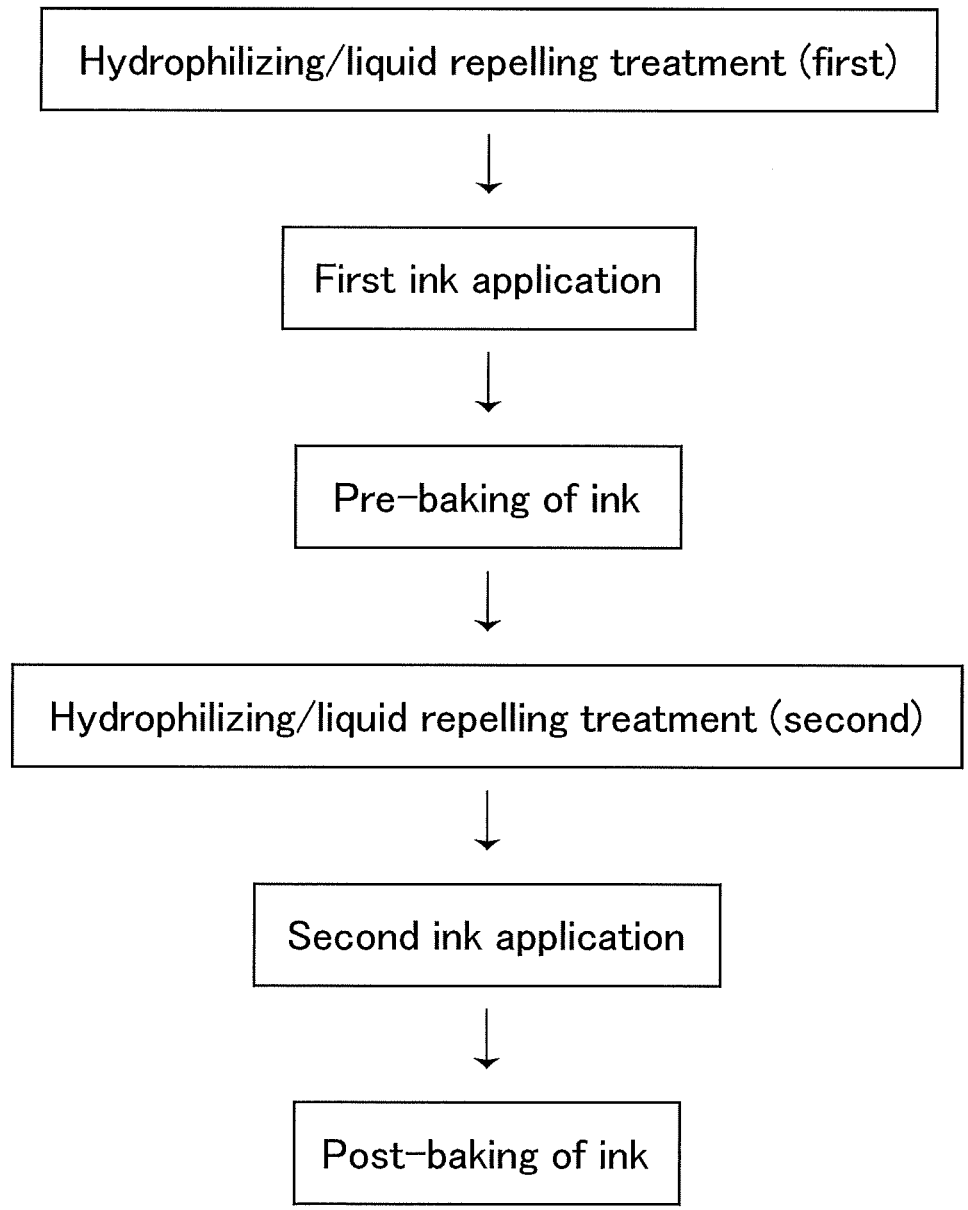
FIG. 2 is a flowchart illustrating a procedure of a color filter substrate manufacturing method of Embodiment 1.

The following describes a color filter substrate manufacturing method of Embodiment 1 in detail. FIG. 2 is a flowchart illustrating a procedure of a color filter substrate manufacturing method of Embodiment 1.

First, a coating made from a resin material containing a black pigment or a metal material having a light shielding property is formed on the entire surface of a transparent substrate (e.g. a glass substrate, a resin substrate), and patterning is performed by photolithography to form a grid-shaped bank 12 that separates substantially rectangular spaces. The regions surrounded by the bank 12 are picture element aperture regions in which color filters 11 are to be formed. In the subsequent step, inks for color filters are dropped onto the picture element aperture regions. The bank 12 serves to maintain the inks for color filters in the predetermined regions. The bank 12 is also referred to as black matrix because of its light shielding property.

In the case where the bank 12 functions as a black matrix, it partially shields light from, for example, the TFT substrate, as desired. This can improve the display quality including the contrast ratio.

In the case of substantially rectangular picture elements, the picture elements slant down moderately from the center to the peripheral short sides, and slant down steeply from the center to the peripheral long sides. Accordingly, an ink applied to a region separated by the bank 12 is subjected to a strong force towards the peripheral long sides from the center of the picture element, and may run over the bank 12 and flow into the adjacent picture element aperture regions. In particular, the probability of ink flowing is higher in the case where the width of the bank is smaller along the long sides of the picture element aperture regions than along the short sides of the picture element aperture regions.

On the other hand, in Embodiment 1, various measures for preventing the occurrence of color mixing (described later) enables employing this design without causing the problem.

Next, inks for color filters are dropped from an inkjet head to picture element aperture regions. In order to effectively prevent inks in picture element aperture regions from running over the bank 12 and flowing into the adjacent picture element aperture regions, a pretreatment, such as a fluorine plasma treatment, is performed on the bank 12 before dropping inks to make the bank 12 liquid repellent.

Figure 3:
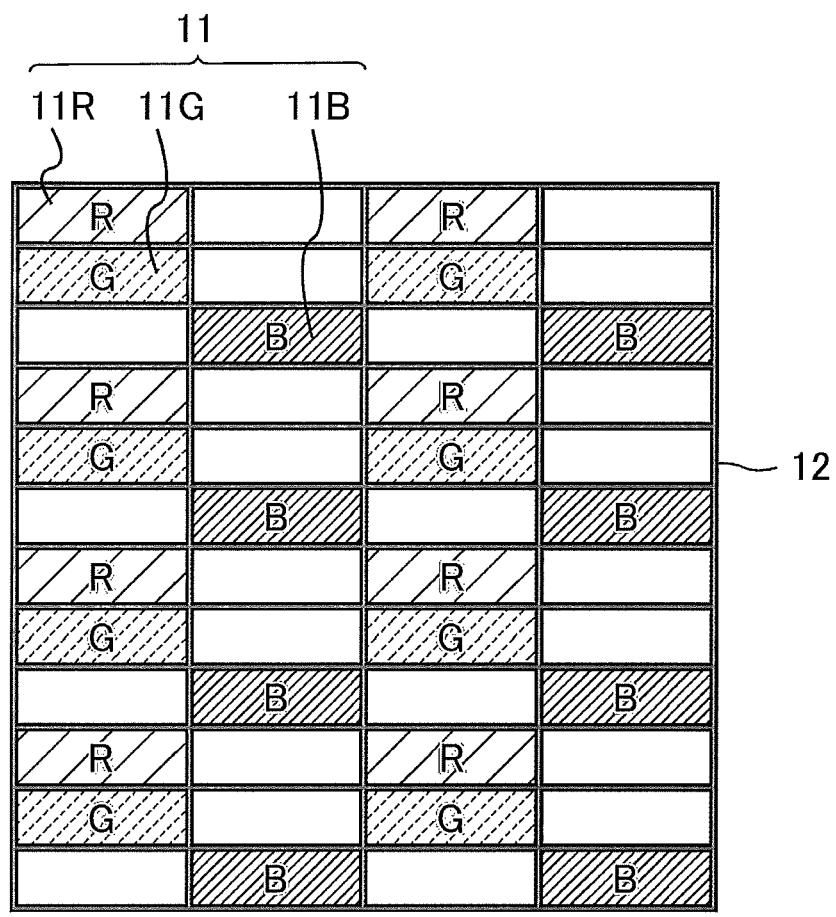
FIG. 3 is a plan view schematically illustrating a first lithography pattern in the manufacture of a color filter substrate of Embodiment 1.
Figure 4:
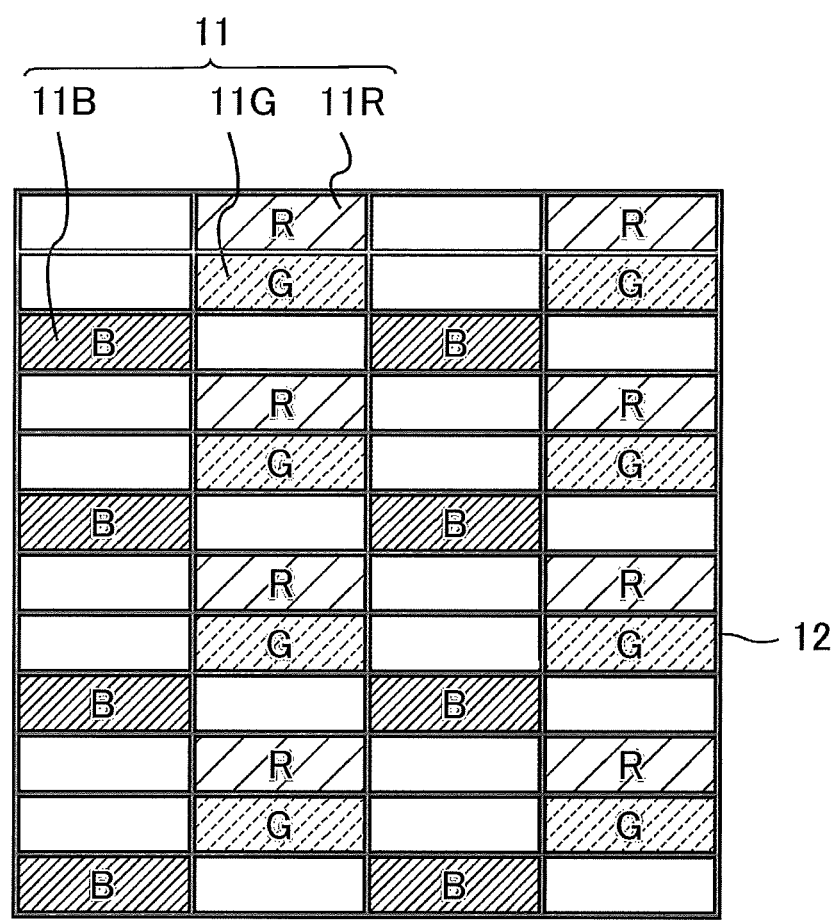
FIG. 4 is a plan view schematically illustrating a second lithography pattern in the manufacture of a color filter substrate of Embodiment 1.

FIG. 3 is a plan view schematically illustrating a first lithography pattern in the manufacture of a color filter substrate of Embodiment 1. FIG. 4 is a plan view schematically illustrating a second lithography pattern in the manufacture of a color filter substrate of Embodiment 1.

As shown in FIG. 3, for each of picture element aperture regions for blue color filters, its two horizontally adjacent picture element aperture regions and two vertically adjacent picture element aperture regions are not filled by the first lithography; for each of picture element aperture regions for red color filters and picture element aperture regions for green color filters, their two horizontally adjacent picture element aperture regions are not filled, but in one of their vertically adjacent picture element aperture regions, a color filter of the other color is produced (that is, a green color filter is produced next to red, and vice versa). Thus, color filters are produced by the first lithography such that horizontally adjacent pixels have alternating color arrangement patterns. For example, in the case where red and green inks are applied to a pixel, only a blue ink is applied to both the horizontally adjacent pixels.

By the second lithography, inks are applied to the unfilled picture element aperture regions adjacent to the target regions of the first lithography, as shown in FIG. 4. Accordingly, the pattern of the second lithography is moved horizontally by one picture element from the pattern of the first lithography. Through the second lithography, all the picture element aperture regions are subjected to ink lithography. Thus, color filters are produced by the second lithography such that the horizontally adjacent pixels also have alternating color arrangement patterns.

In the example shown in FIG. 1, picture elements of three colors, red, green, and blue, are arranged in a stripe pattern. It should be noted that the kind of colors and the arrangement pattern of colors are not especially limited in Embodiment 1.

The following describes the color filter substrate manufacturing method of Embodiment 1 in more detail with reference to a color filter substrate of Reference 1.

Figure 5:
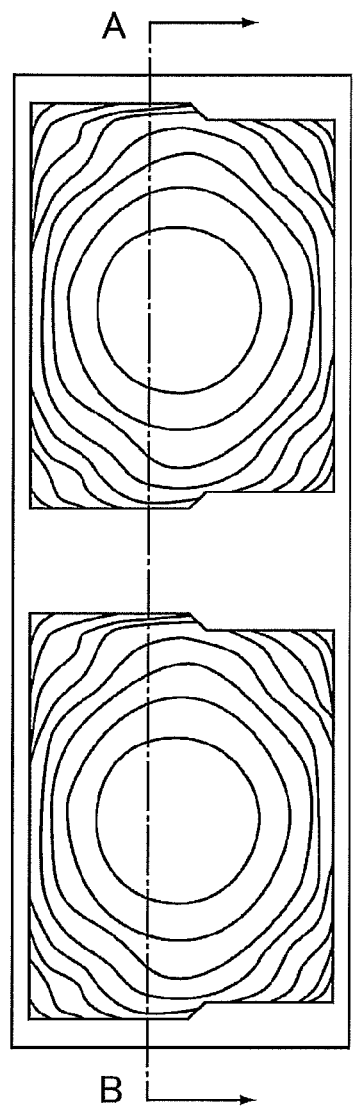
FIG. 5 is a plan view schematically illustrating contours of color filters of a color filter substrate of Reference 1.
Figure 6:
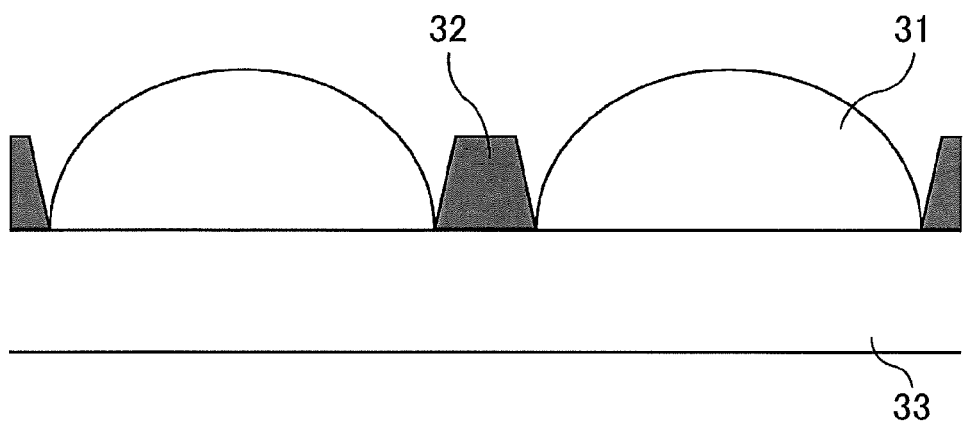
FIG. 6 is a schematic cross-sectional view alone the A-B line in FIG. 5.

The color filter substrate of Reference 1 is a color filter substrate, color filters of which are produced by simultaneously applying inks to all picture element aperture regions in a one-stage procedure. FIG. 5 is a plan view schematically illustrating contours of color filters of a color filter substrate of Reference 1, and FIG. 6 is a schematic cross-sectional view alone the A-B line in FIG. 5. In Reference 1, color filters 31 are produced on a substrate 33, and are surrounded by a bank 32. As shown in FIG. 6, the color filters of the color filter substrate of Reference 1 are substantially semispherical or substantially dome-shaped with their thickness gradually increasing from the periphery (edge) to the center in the picture element aperture regions. As shown in FIG. 5, the color filters, when viewed in a plan view, have substantially concentric circular contours. Thus, the thickness distribution of the color filters is substantially non-uniform in each picture element of the color filter substrate of Reference 1, and the thickness varies substantially over the color filter substrate of Reference 1.

Figure 7:
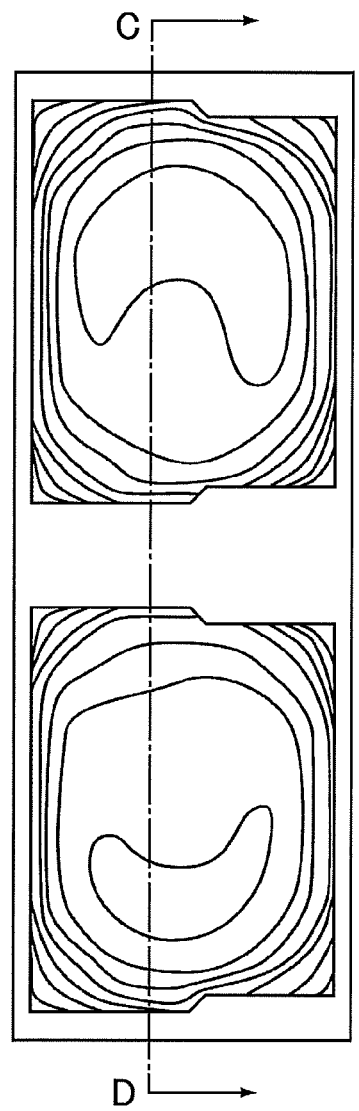
FIG. 7 is a plan view schematically illustrating contours of color filters of a color filter substrate of Reference 2.
Figure 8:
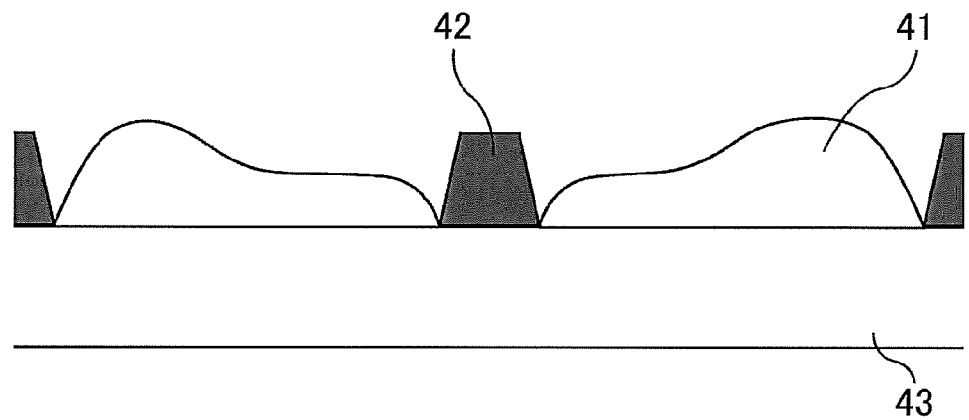
FIG. 8 is a schematic cross-sectional view along the C-D in FIG. 7.

The color filter substrate of Reference 2 is a color filter substrate, color filters of which are produced by a method (checkered pattern lithography) in which for each target picture element aperture region, its two horizontally adjacent picture element aperture regions and two vertically adjacent picture element aperture regions are not filled. FIG. 7 is a plan view schematically illustrating contours of color filters of a color filter substrate of Reference 2, and FIG. 8 is a schematic cross-sectional view along the C-D in FIG. 7. In Reference 2, color filters 41 are produced on a substrate 43, and are surrounded by a bank 42. As shown in FIG. 8, the thickness distribution is more uniform in each picture element aperture region of the color filter substrate of Reference 2 although the thickness is slightly small near the four corners of each picture element aperture region. This structure can prevent light leakage and reduction of color purities in areas with a small thickness.

Comparing lithography to all picture element aperture regions in a one-stage procedure as in Reference 1 and lithography involving first lithography in a checkered pattern as in Reference 2, the checkered pattern lithography as in Reference 2 is better in term of ink flatness as shown in FIGS. 6 and 8. In the case of checkered pattern lithography in which all of picture elements horizontally and vertically adjacent to target regions are not filled, solvents in the inks evaporate in a step of drying the inks to form a gaseous solvent concentration gradient decreasing from the center to unfilled region sides in the target picture element aperture region. Accordingly, the surface tension of inks increases towards unfilled region sides. This is why the inks uniformly extend to unfilled region sides. By contrast, in the case of a one-stage lithography procedure to all picture element aperture regions, the gaseous solvent concentration is uniform in surrounding picture element aperture regions. Accordingly, the inks are under a strong force that forms them into a part of a spherical shape. Thus, more ink gathers at the center in each picture element.

Figure 9:
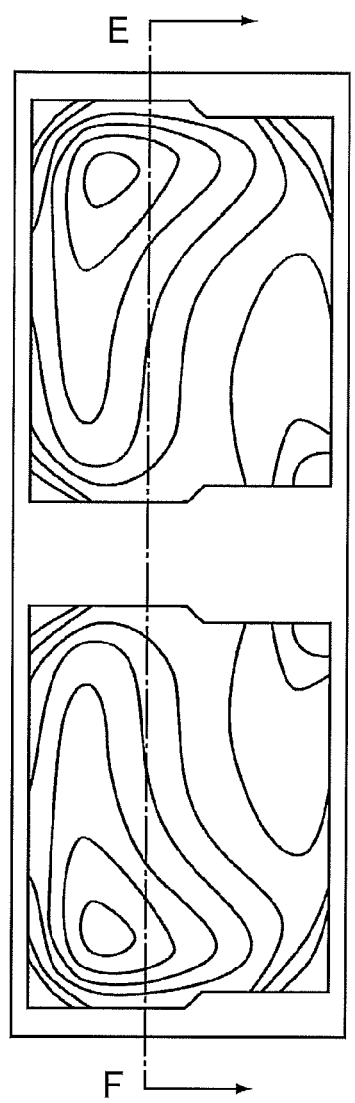
FIG. 9 is a plan view schematically illustrating contours of color filters of a color filter substrate of Reference 3.
Figure 10:
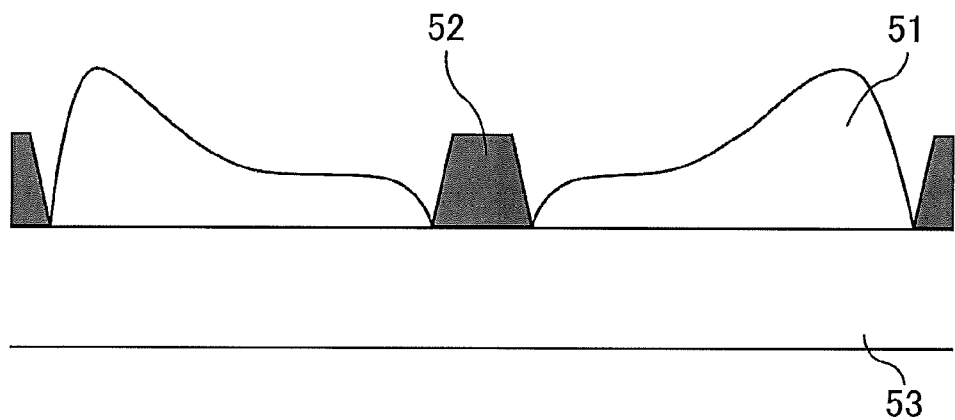
FIG. 10 is a schematic cross-sectional view along the E-F line in FIG. 9.

The following shows the results of investigation on the relationship between the presence or absence of inks in surrounding picture elements and the distribution of ink. FIG. 9 is a plan view schematically illustrating contours of color filters of a color filter substrate of Reference 3, and FIG. 10 is a schematic cross-sectional view along the E-F line in FIG. 9. In Reference 3, color filters 51 are produced on a substrate 53, and are surrounded by a bank 52. The color filter substrate of Reference 3 includes color filters produced by ink lithography involving a step in which for each target picture element aperture region, one of horizontally adjacent regions is not filled and an ink is applied to the other region in the same procedure. In this case, inks dropped in the picture element aperture regions spread towards unfilled region sides. Consequently, as shown in FIG. 9, contours of color filters viewed in a plan view show that the filters become thicker towards an unfilled region and become thinner towards a region to which an ink is applied in the same procedure.

This reveals that an effective strategy to prevent formation of substantially semispherical or substantially dome-shaped inks is to apply inks to target picture element aperture regions without applying an ink to at least one of regions adjacent to each target region, and a preferable strategy to produce color filters having a more uniform thickness distribution is to apply inks to target picture element aperture regions without applying inks to all apertures vertically and horizontally adjacent to the target regions.

However, the color filter substrate of Reference 2 has a disadvantage in that the thickness distribution of color filters produced in the second inkjet step is not similar to that of color filters produced in the first inkjet step although the color filters produced in the first inkjet step have a uniform thickness distribution. Such a difference in thickness distribution is responsible for flicker on displays such as televisions, in particular, in a dot inversion mode. In view of this, the method of Embodiment 1 employing a combination of the method of Reference 2 and the method of Reference 3 is envisaged. Namely, color filters produced in Embodiment 1 include those having a cross-sectional shape as shown in FIG. 8 and those having a cross-sectional shape as shown in FIG. 10.

Thus, the first inkjet step provides color filters, the shape and thickness distribution of which vary. Since color filters produced in the second inkjet step vary in shape and thickness distribution depending on the presence or absence and shape of adjacent color filters, this method provides color filters arranged in a more random pattern over the substrate. This remarkably contributes to suppression of flicker.

After the first lithography, a pre-baking step is preferably performed. The pre-baking step is, for example, a heating or vacuum drying step for sufficiently drying the inks until they lose flowability. The pre-baking step is effective especially when inks containing a heat-polymerizable material are used. The multi-stage ink application method of Patent Literature 3 involves leaving inks for a predetermined time after the first lithography stage so that an ink on the bank flows into its target picture element aperture region due to the liquid repellency of the bank surface. If this step is not enough to sufficiently dry inks, color mixing occurs when an ink runs over in the subsequent ink application step. In particular, by the second ink lithography, the liquid repellency of the bank may not be at a sufficient level even when the liquid repellency by the first ink lithography is at a sufficient level. This is because solvents in the inks applied by the first ink lithography evaporate to reduce the liquid repellency of the bank. Accordingly, it is preferable to perform the pre-baking step in order to sufficiently dry the inks. Additionally, the pre-baking step is effective insufficiently evaporating other volatile components as well. Considering that the first ink lithography reduces the liquid repellency of the bank surface, it is more preferable to perform a liquid repelling treatment such as a fluorine plasma treatment again on the bank after the pre-baking step. Additionally, it is preferable to perform a hydrophilizing treatment on regions of the substrate to which inks have not been applied.

In the case where an ink runs into an adjacent picture element aperture region, an ink removing step using a laser is performed. Actually, as described above, the removing step using a laser is not enough to completely remove all inks, and may partially leave an ink as a rim along an inner wall of the bank. However, by removing inks as much as possible, the influence of color mixing can be further reduced.

Before the laser treatment, the substrate is checked for the presence or absence of defects after the first lithography, and the treatment for removing a dried ink is performed selectively on picture elements with a defect. Examples of usable lasers include YAG (Yttrium Aluminum Garnet) lasers. This removing step using a laser can also be performed in cases other than color mixing, such as contamination of foreign matter.

Then, inks are applied to unfilled picture element aperture regions by the second ink lithography, and furthermore, a post-baking step is performed. Thus, all color filters are produced.

Subsequently, steps including a step for forming a common electrode on the color filters and a step for forming an alignment film on the common electrode are performed. In this manner, a color filter substrate is manufactured. The color filter substrate is attached, through a liquid crystal layer, to a TFT substrate separately prepared. In this manner, a liquid crystal display panel is manufactured. The liquid crystal display panel produced through these steps includes a pair of substrates, the color filter substrate and the TFT substrate, and a liquid crystal layer between the pair of substrates. Optionally, optical films such as retarder films and polarizing plates may be attached to both surfaces of the liquid crystal display panel, a backlight and the like is set behind the liquid crystal display panel. Thus, a liquid crystal display device is manufactured.

Figures 11, 12:
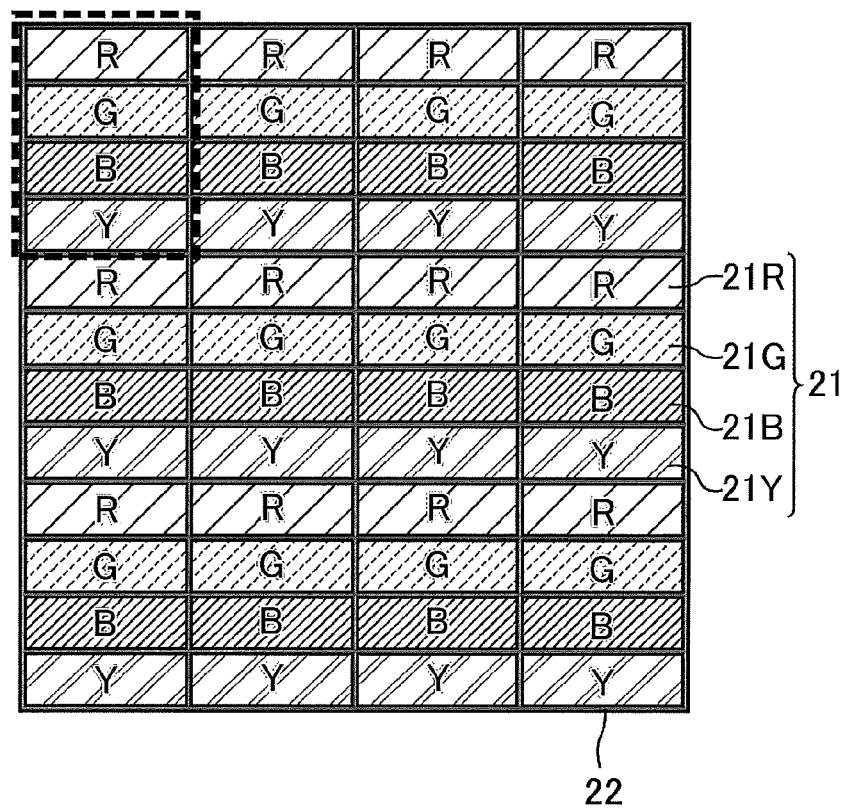
FIG. 11 is a plan view schematically illustrating polarities of potentials of pixel electrodes of a TFT substrate based on a potential of a common electrode of a liquid crystal display device of Embodiment 1.
FIG. 12 is a plan view schematically illustrating a color arrangement pattern of a color filter substrate of Embodiment 2.

The following describes a dot inversion driving mode in detail. FIG. 11 is a plan view schematically illustrating polarities of potentials of pixel electrodes of a TFT substrate based on a potential of a common electrode of the liquid crystal display device of Embodiment 1. In FIG. 11, one of each adjacent pixel electrode pair in a dot inversion driving mode says "+", and the other says "−". This structure can prevent both vertical shadows and horizontal shadows, and improve the display quality. The polarity of a voltage applied to each pixel electrode can be controlled with, for example, a source driver connected to the pixel electrodes. The liquid crystal display device of Embodiment 1 is particularly suited for such a dot inversion driving mode.

Embodiment 2

Embodiment 2 is another example of the color filter substrate manufacturing method of the present invention. The structure of the color filter of Embodiment 2 is the same as that of the color filter substrate of Embodiment 1 except for the number of colors of color filters and except that inks are simultaneously applied to two adjacent picture element aperture regions that belong to different pixels.

FIG. 12 is a plan view schematically illustrating a color arrangement pattern of a color filter substrate of Embodiment 2. In Embodiment 2, as shown in FIG. 12, a plurality of pixels each consisting of four picture elements of four different colors, red, green, blue, and yellow, are arranged on a color display screen. The picture elements are substantially rectangular, and are arranged vertically in the order of red, green, blue, and yellow in a matrix. In FIG. 12, a region surrounded by the dotted line corresponds to one pixel. On the respective regions for red, green, blue, and yellow picture elements, red color filters 21R, green color filters 21G, blue color filters 21B, and yellow color filters 21Y are produced. These color filters 21 are individually separated by a bank (partition) 22. The arrangement pattern of picture elements in each pixel is the same, and specifically is a stripe arrangement pattern in which picture elements of the same color are arranged horizontally.

In Embodiment 2, the color filter substrate includes color filters of the fourth color, yellow, in addition to color filters of the three colors, red, green, and, blue. The kind of colors and the arrangement pattern of colors are not especially limited in Embodiment 2, and other colors may be used instead. For example, instead of yellow, another color such as magenta, cyan, or white (transparent color) may be used.

Figure 13:
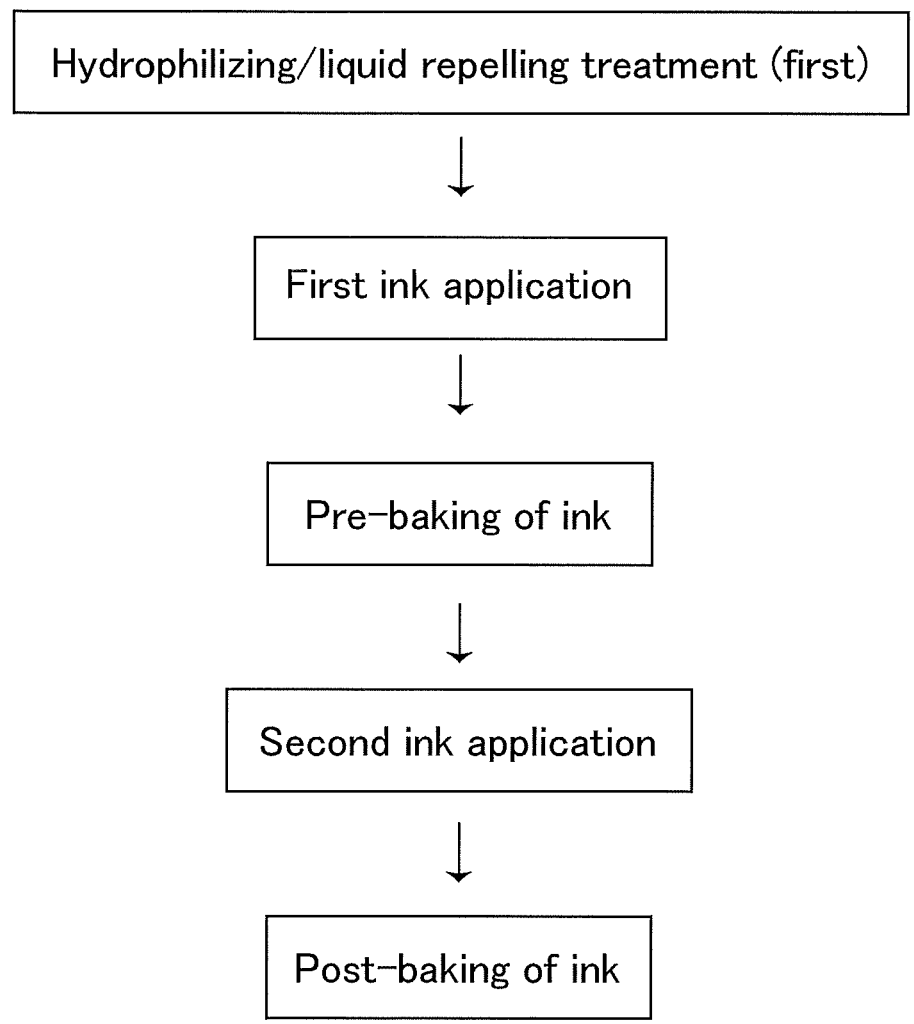
FIG. 13 is a flowchart illustrating a procedure of a color filter substrate manufacturing method of Embodiment 2.

The following describes a color filter substrate manufacturing method of Embodiment 2 in detail. FIG. 13 is a flowchart illustrating a procedure of a color filter substrate manufacturing method of Embodiment 2.

Figure 14:
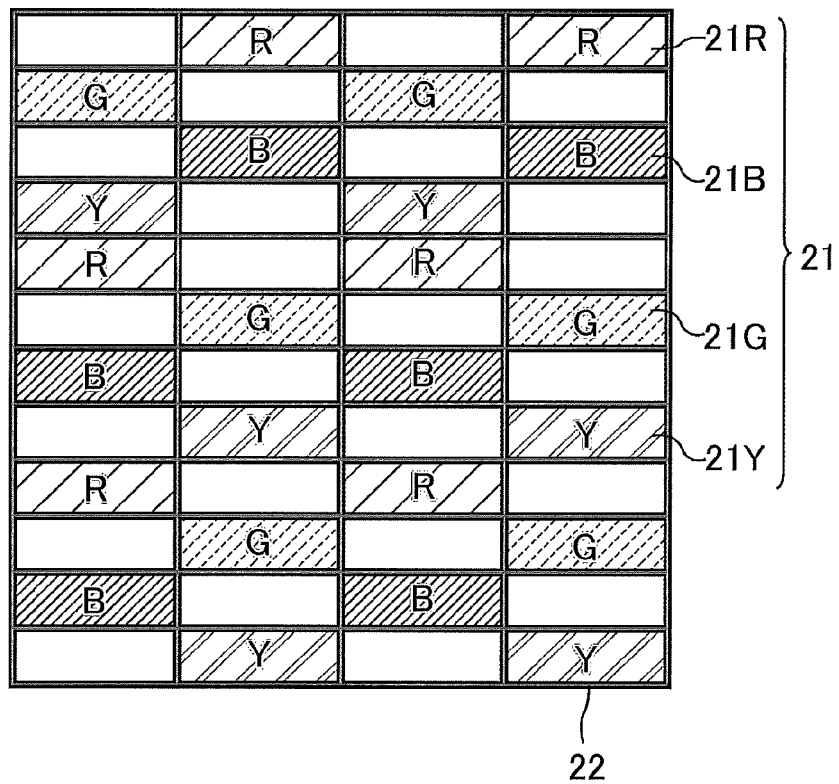
FIG. 14 is a plan view schematically illustrating a first lithography pattern in the manufacture of a color filter substrate of Embodiment 2.
Figure 15:
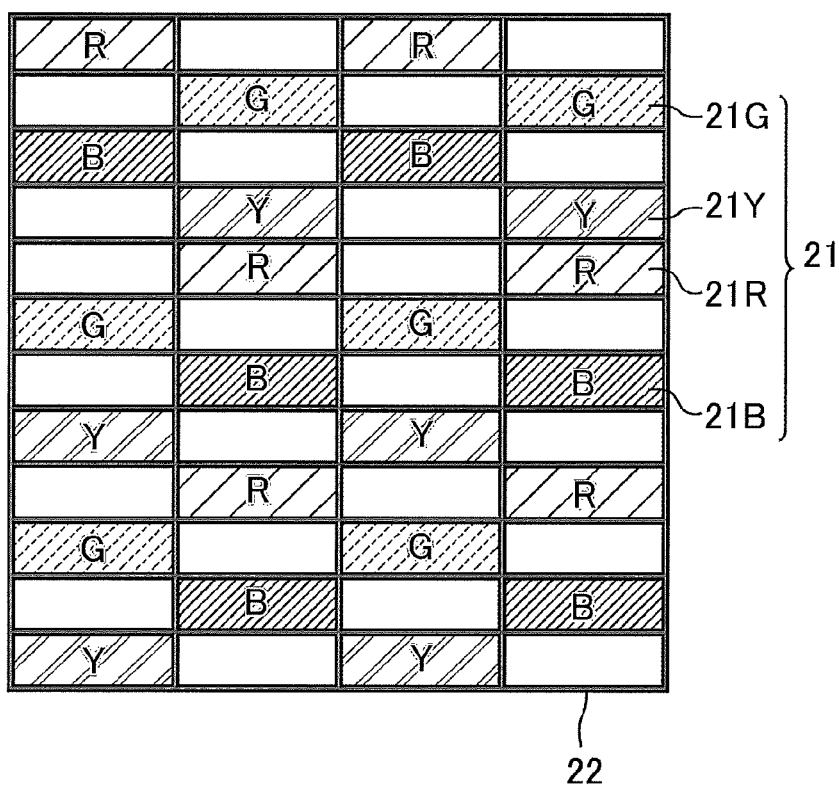
FIG. 15 is a plan view schematically illustrating a second lithography pattern in the manufacture of a color filter substrate of Embodiment 2.
Figure 16:
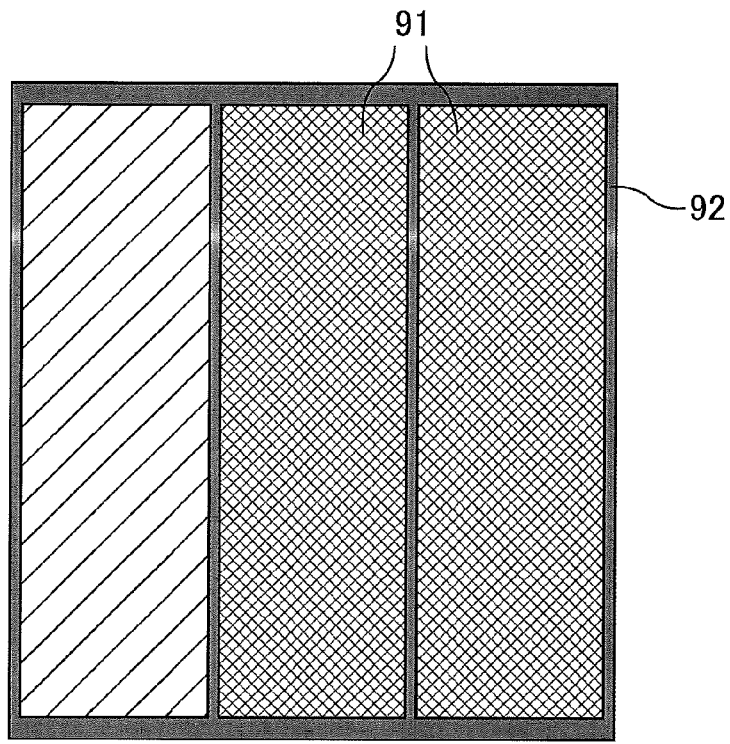
FIG. 16 is a plan view schematically illustrating color filters, the colors of which are mixed as a result of a one-stage procedure of applying inks of different colors to a plurality of picture element aperture regions.
Figure 17:
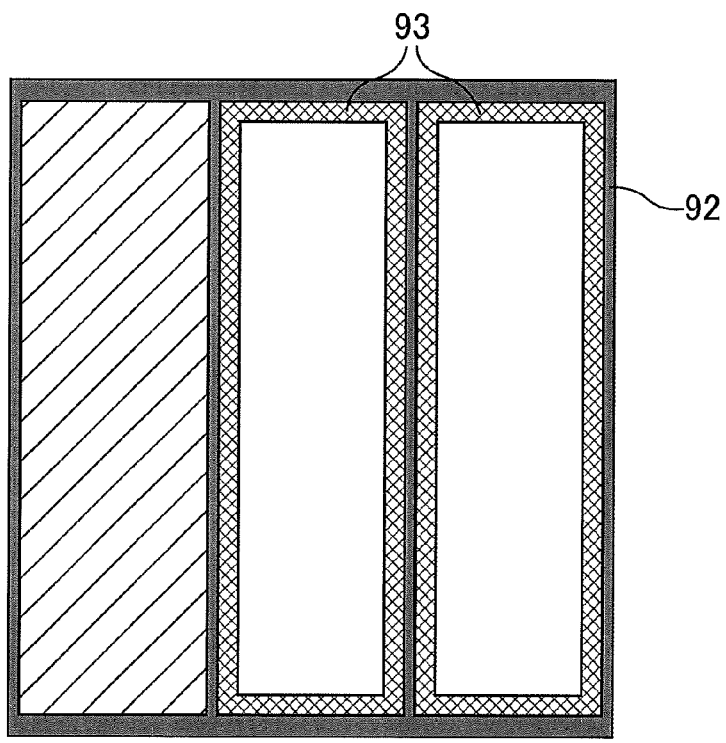
FIG. 17 is a plan view schematically illustrating color filters after removing regions with a mixed color by using a laser.
Figure 18:
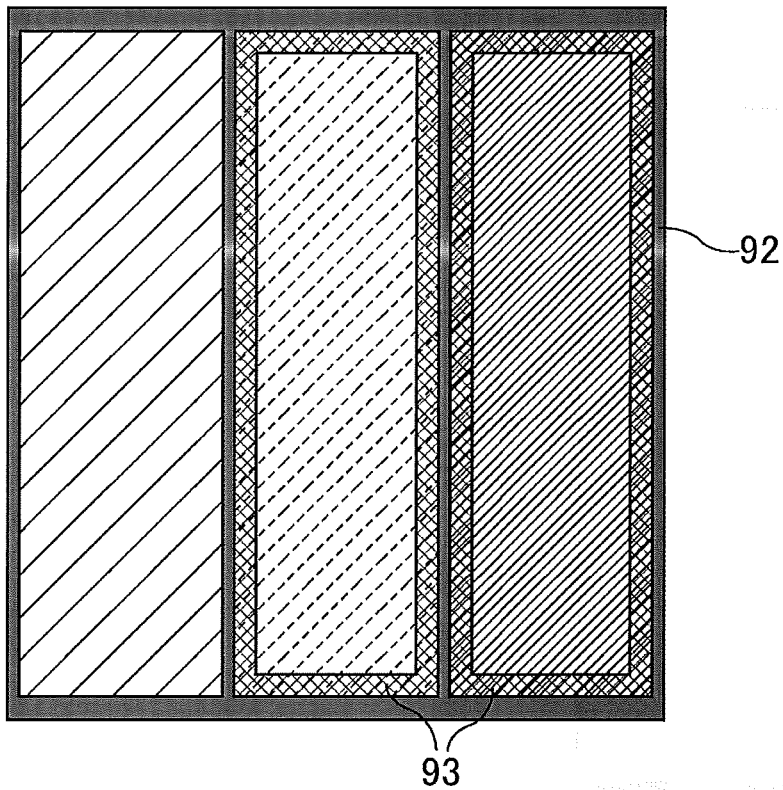
FIG. 18 is a plan view schematically illustrating color filters after re-application of inks following the removal using a laser.
Figure 19:
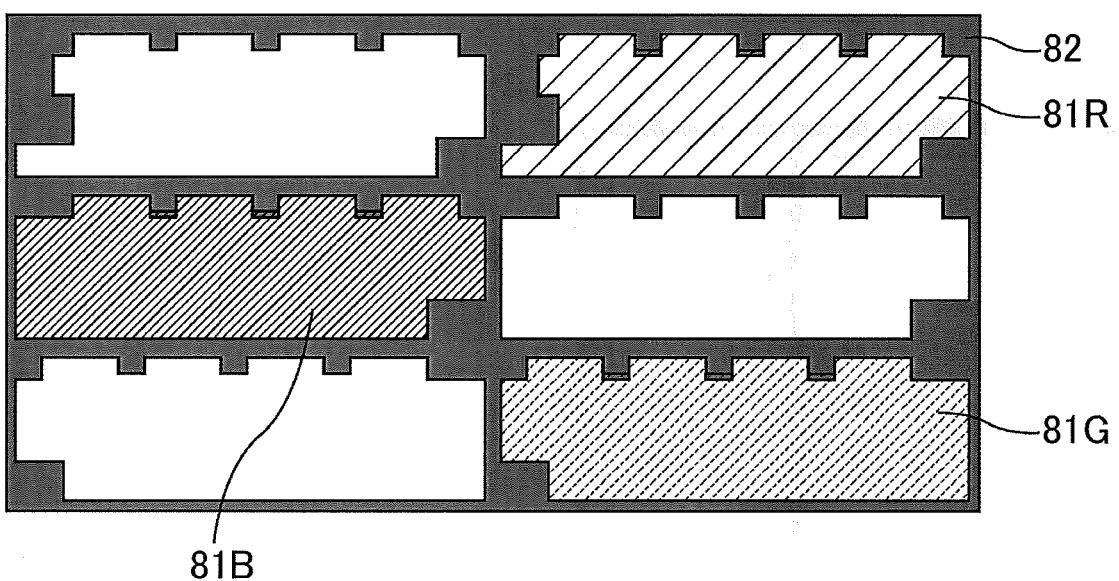
FIG. 19 is a plan view schematically illustrating pairs of color filters of the same color which are produced by applying an ink to one of each pair of adjacent picture element aperture regions, and successively applying an ink to the other picture element aperture region. This is a view illustrating a lithography pattern after the first ink application.
Figure 20:
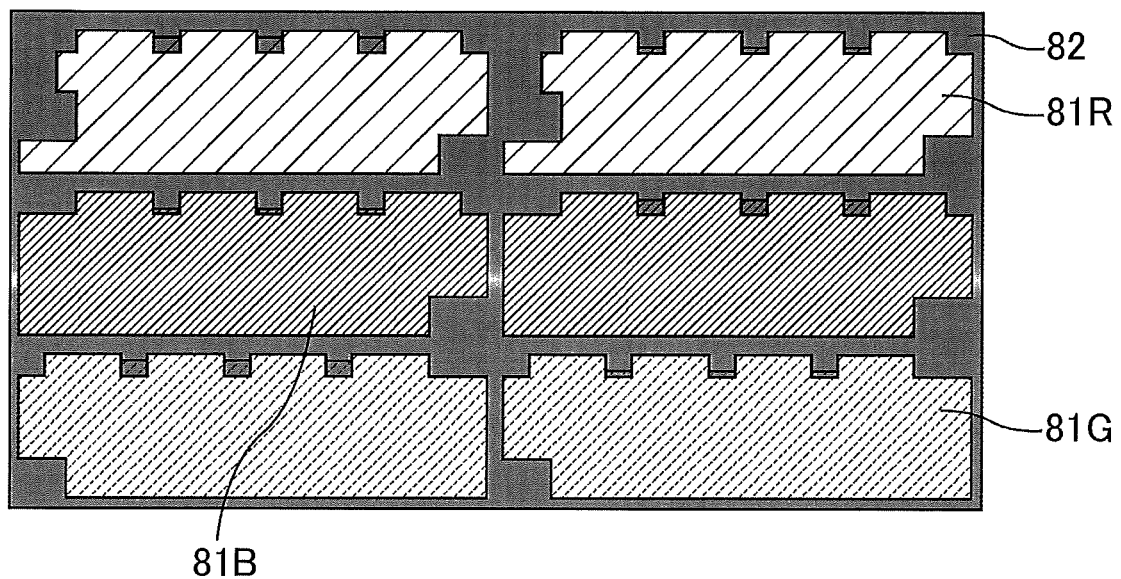
FIG. 20 is a plan view schematically illustrating pairs of color filters of the same color which are produced by applying an ink to one of each pair of adjacent picture element aperture regions, and successively applying an ink to the other picture element aperture region. This is a view illustrating a lithography pattern after the second ink application.
Figure 21:
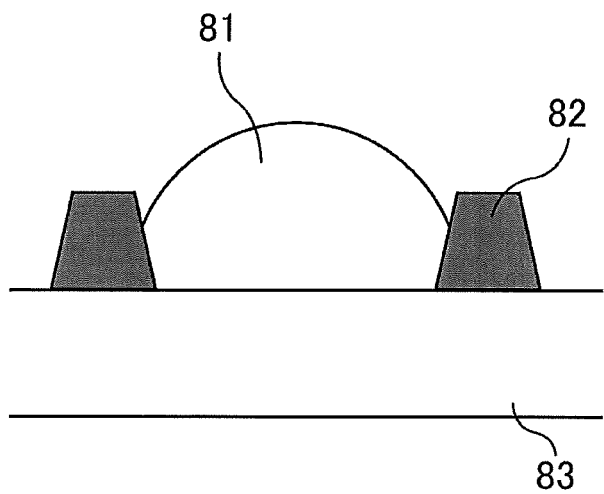
FIG. 21 is a schematic cross-sectional view of a color filter shown in FIG. 19.
Figure 22:
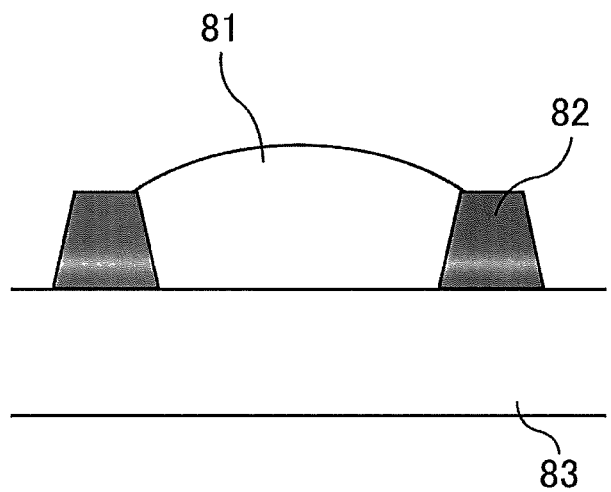
FIG. 22 is a schematic cross-sectional view of a color filter shown in FIG. 20.

FIG. 14 is a plan view schematically illustrating a first lithography pattern in the manufacture of a color filter substrate of Embodiment 2. FIG. 15 is a plan view schematically illustrating a second lithography pattern in the manufacture of a color filter substrate of Embodiment 2.

As shown in FIG. 14, for each of picture element aperture regions for green color filters and picture element aperture regions for blue color filters, their two horizontally adjacent picture element aperture regions and two vertically adjacent picture element aperture regions are not filled by the first lithography; for each of picture element aperture regions for red color filters and picture element aperture regions for yellow color filters, their two horizontally adjacent picture element aperture regions are not filled, but in one of their vertically adjacent picture element aperture regions, a color filter of the other color is produced (that is, a yellow color filter is produced next to red, and vice versa). These vertically adjacent color filters respectively belong to different pixels, and the first lithography pattern does not include color filters in two adjacent picture element aperture regions in the same pixel, as shown in FIG. 14. Additionally, color filters are produced by the first lithography such that horizontally and vertically adjacent pixels have alternating color arrangement patterns. For example, in the case where green and yellow inks are applied to a pixel, red and blue inks are applied to all the pixels horizontally and vertically adjacent to this pixel.

By the second lithography, inks are applied to the unfilled picture element aperture regions adjacent to the target regions of the first lithography, as shown in FIG. 15. Accordingly, the pattern of the second lithography is moved horizontally by one picture element from the pattern of the first lithography. Through the second lithography, all the picture element aperture regions are subjected to ink lithography. Thus, color filters are produced by the second lithography such that the horizontally and vertically adjacent pixels also have alternating color arrangement patterns.

Similarly to Embodiment 1, the lithography method of Embodiment 2 reduces the difference in thickness distribution and shape between color filters produced by the first lithography and color filters produced by the second lithography, and thus provides color filters arranged in a more random pattern over the substrate. Accordingly, the method remarkably contributes to suppression of flicker.

After the first lithography, a pre-baking step is preferably performed. The pre-baking step may not be followed by a liquid repelling treatment, such as a fluorine plasma treatment, on the bank and a hydrophilizing treatment on the substrate surface. This is because the temperature in the pre-baking step is low and does not reduce the liquid repellency of the bank. This also applies to the hydrophilicity of the substrate surface.

In the case where an ink runs into an adjacent picture element aperture region, an ink removing step using a laser is performed.

After the second ink lithography, a post-baking step is performed. Thus, all color filters are produced.

Subsequently, steps including a step for forming a common electrode on the color filters and a step for forming an alignment film on the common electrode are performed. In this manner, a color filter substrate is manufactured. The color filter substrate is attached, through a liquid crystal layer, to a TFT substrate separately prepared. In this manner, a liquid crystal display panel is manufactured. The liquid crystal display panel produced through these steps includes a pair of substrates, the color filter substrate and the TFT substrate, and a liquid crystal layer between the pair of substrates. Optionally, optical films such as retarder films and polarizing plates may be attached to both surfaces of the liquid crystal display panel, a backlight and the like is set behind the liquid crystal display panel. Thus, a liquid crystal display device is manufactured.

Similarly to the liquid crystal display device of Embodiment 1, the liquid crystal display device of Embodiment 2 is particularly suited for dot inversion driving mode liquid crystal display devices.

The present application claims priority to Patent Application No. 2011-121610 filed in Japan on May 31, 2011 under the Paris Convention and provisions of national law in a designated State, the entire contents of which are hereby incorporated by reference.

REFERENCE SIGNS LIST 11, 21, 31, 41, 51: Color filter
11R, 21R, 81R: Red color filter
11G, 21G, 81G: Green color filter
11B, 21B, 81B: Blue color filter
21Y: Yellow color filter
12, 22, 32, 42, 52, 82, 92: Bank (partition)
33, 43, 53: Substrate
91: Color filter with mixed color
93: Rim

The invention claimed is:

1. A color filter substrate manufacturing method comprising:
    a first inkjet step of applying inks simultaneously to at least two of a plurality of regions separated by a grid-shaped partition; and
    a second inkjet step of applying an ink to at least one of regions to which the inks are not applied in the first inkjet step,
    wherein at least one of inks applied in the first inkjet step is a first ink that is applied to a first target region without applying inks to regions vertically and horizontally adjacent to the first target region, and
    at least one of the other inks applied in the first inkjet step is a second ink that is applied to a second target region while another ink is applied to one of regions vertically and horizontally adjacent to the second target region.

2. The color filter substrate manufacturing method according to claim 1 comprising, between the first inkjet step and the second inkjet step, a pre-baking step for drying the inks applied in the first inkjet step.

3. The color filter substrate manufacturing method according to claim 1 comprising, between the first inkjet step and the second inkjet step, a liquid repelling step of liquid repelling treatment to a surface of the partition surrounding the inks applied in the first inkjet step.

4. The color filter substrate manufacturing method according to claim 1,
    wherein color filters are produced in the first inkjet step and the second inkjet step such that pixel units each consisting of color filters of a plurality of colors are repeatedly arranged.

5. The color filter substrate manufacturing method according to claim 4,
    wherein color filters are produced in the first inkjet step such that vertically adjacent pixel units and/or horizontally adjacent pixel units have alternating color arrangement patterns.

6. The color filter substrate manufacturing method according to claim 4,
    wherein the first ink has a color with the lowest transmissivity among the plurality of colors.

7. The color filter substrate manufacturing method according to claim 6,
    wherein each of the pixel units consists of a combination of a red picture element, a green picture element, and a blue picture element, and
    the first ink is a blue ink.

8. The color filter substrate manufacturing method according to claim 6,
    wherein each of the pixel units consists of a combination of a red picture element, a green picture element, a blue picture element, and a yellow picture element, and
    the first ink is a blue ink.

9. The color filter substrate manufacturing method according to claim 6,
    wherein the first ink and the second ink are applied in such a manner as to produce color filters in the same pixel.

10. The color filter substrate manufacturing method according to claim 6,
    wherein the first ink and the second ink are applied in such a manner as to produce color filters in different pixels, respectively.

11. A display device manufacturing method comprising the color filter substrate manufacturing method according to claim 1.

12. The display device manufacturing method according to claim 11,
    wherein the display device comprises a plurality of pixel electrodes and a common electrode, and
    for each pair of adjacent pixel electrodes among the plurality of pixel electrodes, the pixel electrodes have a potential with an opposite polarity based on a potential of the common electrode.

13. A color filter substrate manufactured by the color filter substrate manufacturing method according to claim 1.

14. A display device comprising the color filter substrate according to claim 13.

* * * * *